Figure 1:
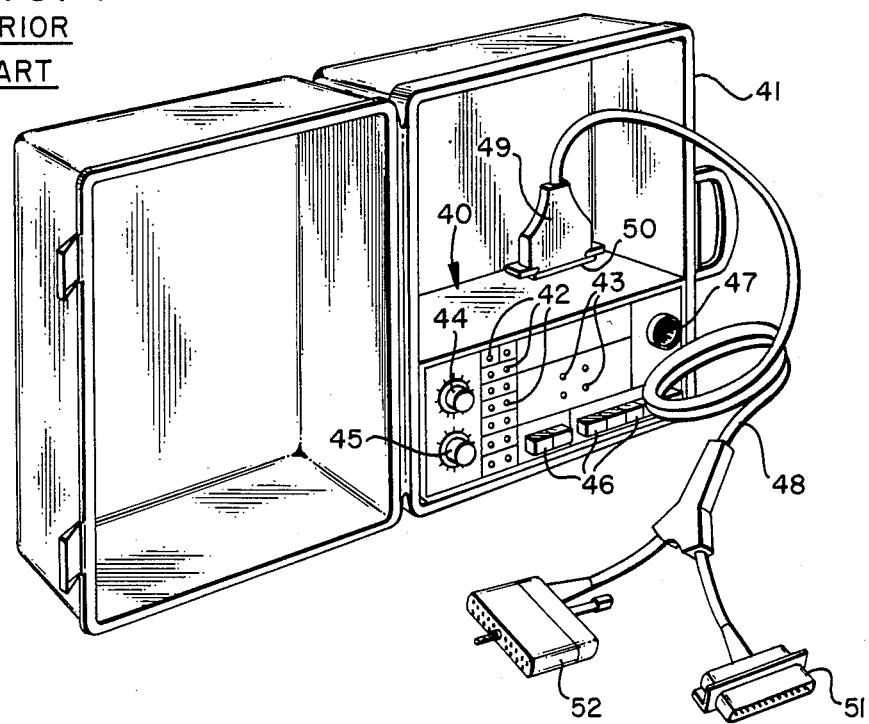

United States Patent [19]

Colborn

[11] Patent Number: 4,567,756
[45] Date of Patent: Feb. 4, 1986

[54] ELECTRONIC ENGINE CONTROL SYSTEMS ANALYZER

[76] Inventor: Nicol S. Colborn, 534 Wentworth Dr., Richardson, Tex. 75081

[21] Appl. No.: 593,026

[22] Filed: Mar. 23, 1984

[51] Int. Cl.$^4$ .......................................... G01M 15/00
[52] U.S. Cl. ...................................................... 73/118
[58] Field of Search ...................... 73/116, 117.3, 118; 371/15, 16, 17, 20, 23, 26

[56] References Cited

U.S. PATENT DOCUMENTS 4,325,251 4/1982 Kanegae ...................... 73/117.3 X
4,402,217 9/1983 Higashiyama ...................... 73/117.3

FOREIGN PATENT DOCUMENTS 2019585 10/1979 United Kingdom ................... 73/118

Primary Examiner—Jerry W. Myracle
Attorney, Agent, or Firm—Warren H. Kintzinger

[57] ABSTRACT

An electronic engine control system test analyzer using a basic test switching control box connectable to a standard digital volt/ohm meter or oscilloscope not just a special unit that a specific model and year car uses. It is a relatively small versatile test switching control box useable with substantially any modern day electronic engine control system. Adaptability from vehicle to vehicle electronic control system is accomplished via change of wire harnesses specific to each different vehicle system without changing the test switching control box. The test switching control box is a much less expensive unit than its counterpart dedicated to a specific make model and vintage vehicle and is in modular form that can be updated to greater numbers of test positions from time to time.

8 Claims, 8 Drawing Figures

ELECTRONIC ENGINE CONTROL SYSTEMS ANALYZER

This invention relates in general to electronic engine control system analyzers, and more particularly to an electronic engine control system test system using a basic test switching control box useable with many electronic engine control systems with adaptability from vehicle to vehicle system accomplished via change of wire harnesses specific to respective different vehicle systems.

Most present day automotive vehicle manufactures producing vehicles with electronic engine control systems produce test analyzers specific for respective vehicle models. With the proliferation of vehicle models each year and model changes year after year there is substantial expense obtaining the numerous special test units required. Further, as the years pass storage and maintainance of an indexing system for such test units can assume an expense item of significant magnitude. This also becomes a problem even for the highly skilled mechanic or engine technician in having to jump from use of one test unit to another of many units for specific automobile models. It is indeed a test of memory and constant refamiliarization in order to properly test and analyze specific electronic engine control units. Further, it is important that the artificial requirement for oscilloscopes especially tailored to specific test units be eliminated with a basic oscilloscope being useable with a basic test switching control box useable between different electronic engine control systems via change of wire harnesses specific to each different vehicle system. It is a test system control box connectable to a standard digital volt/ohm meter or oscilloscope.

It is therefore a principal object of this invention to provide an engine electronic control system test analyzer countering requirements for multitudinous special test units specific for respective car models.

Another object is to provide more efficient, less expensive testing and analyzing services for an extensive variety of vehicle electronic engine control systems.

A further object is to provide an engine electronic control system test analyzer system using a basic standard digital volt/ohm meter or oscilloscope in place of special units useable only with specific test units.

Still another object is enhanced engine electronic control system testing flexability with interchangeably used modular units.

Features of the invention useful in accomplishing the above objects include, in an electronic engine control system test analyzer, a basic test switching control box connectable in a working test system to a standard digital volt/ohm meter or oscilloscope not just a special unit that a specific model and year car uses. The control box is a relatively small versatile test switching control box useable with substantially any modern day electronic engine control system with adaptability from vehicle to vehicle electronic control system accomplished via change of wire harness interconnect specific to each different vehicle system without changing the test switching control box.

Specific embodiments representing what are presently regarded as the best mode of carrying out the invention are illustrated in the accompanying drawings.

Figure 2:
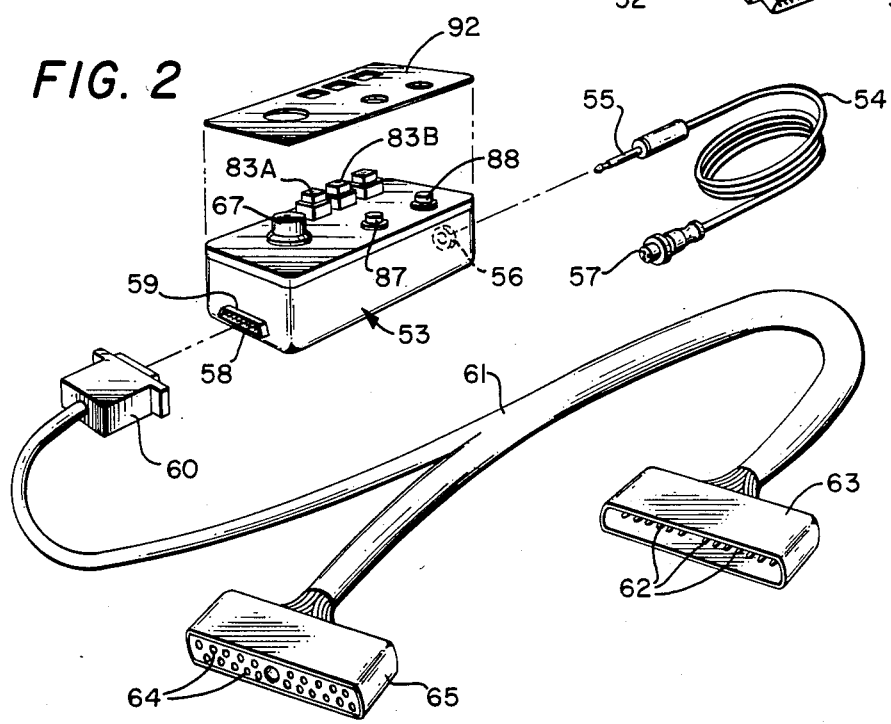
Figure 3:
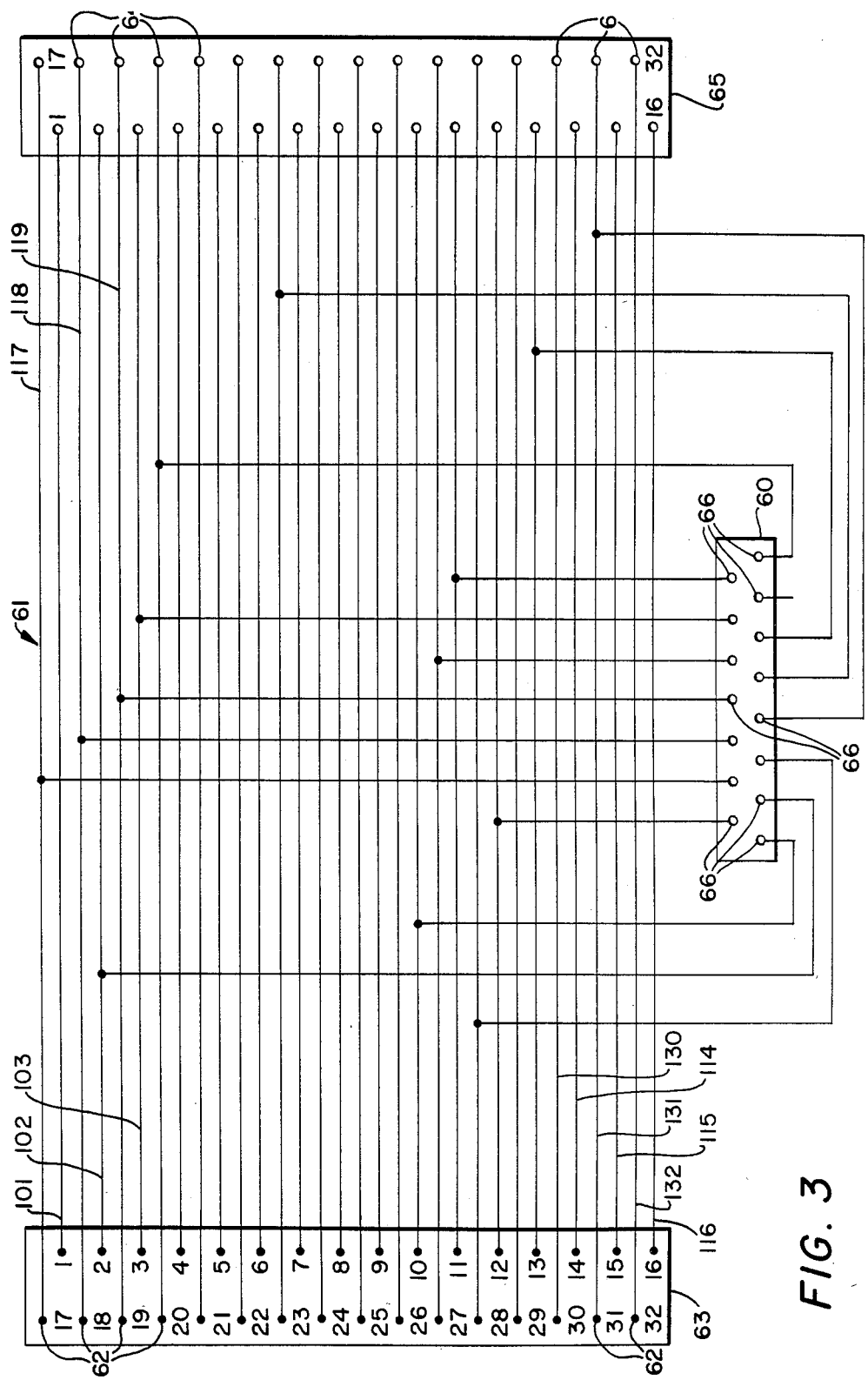
Figure 4:
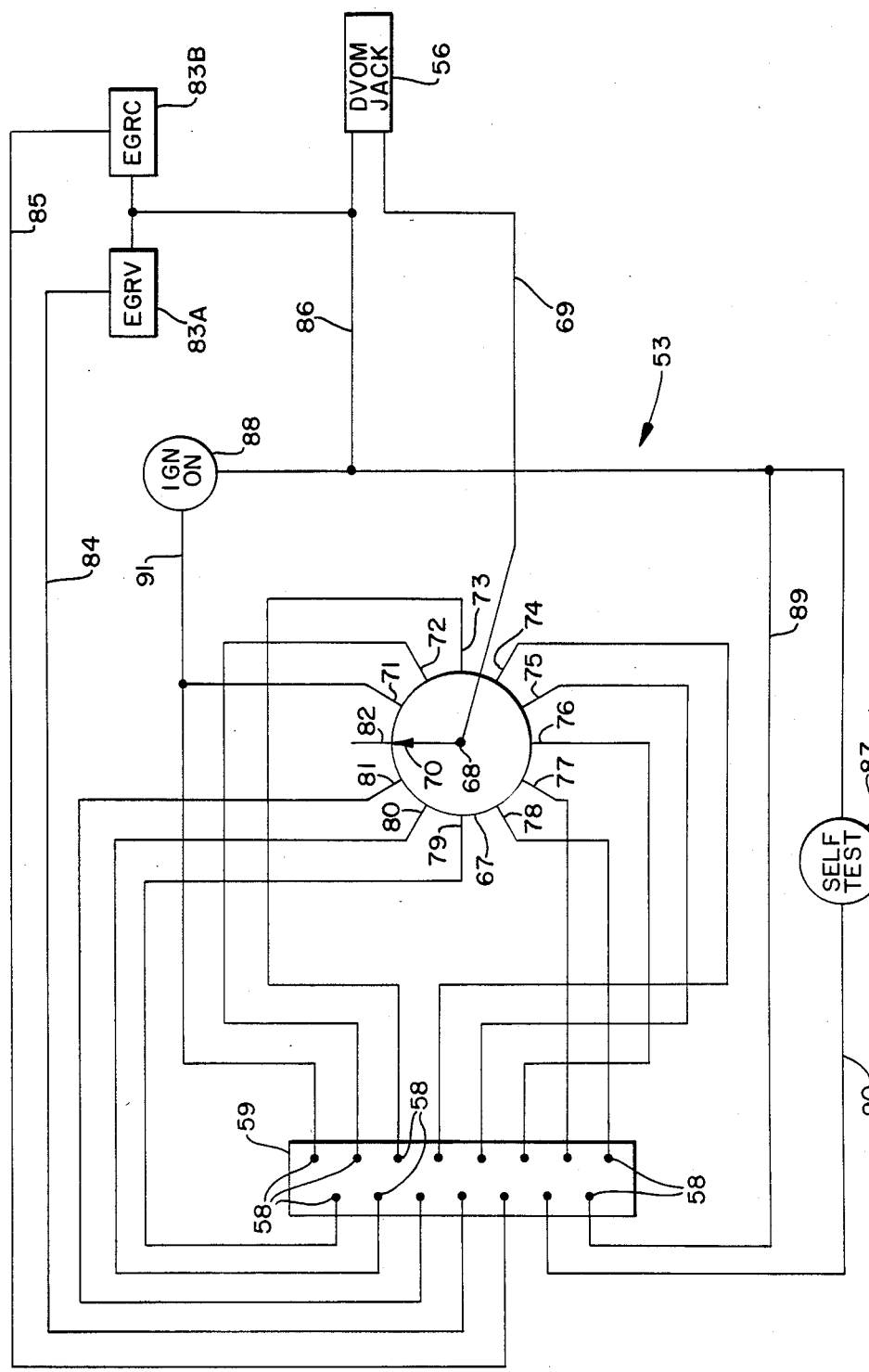
Figure 5:
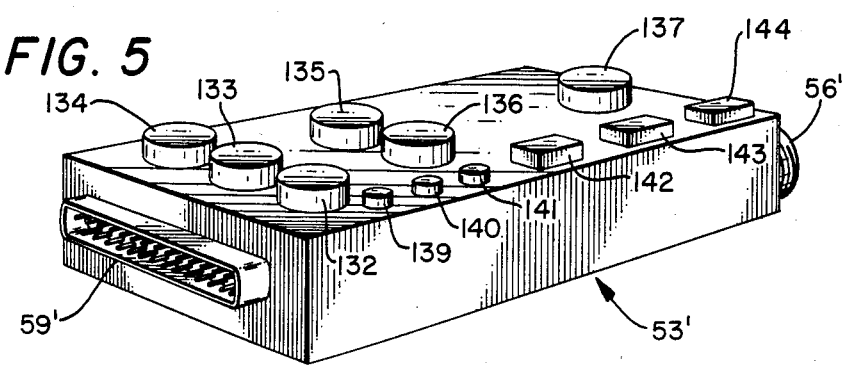
Figure 6:
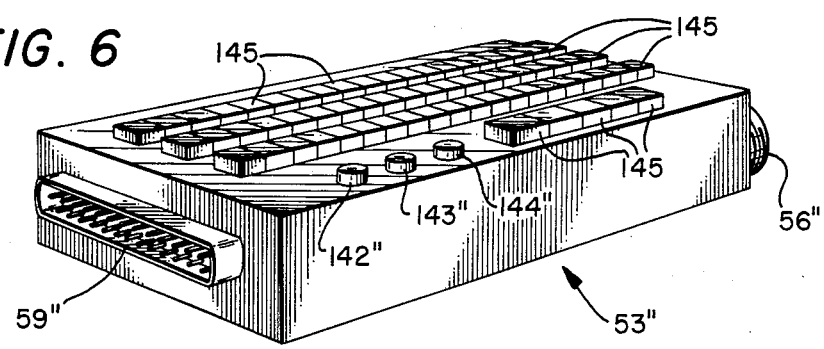
Figure 7:
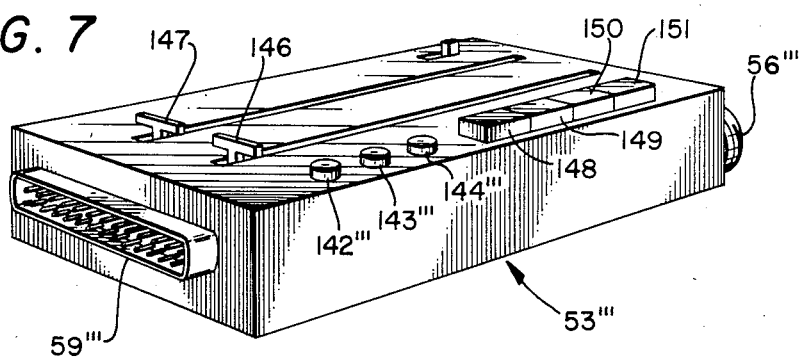
Figure 8:
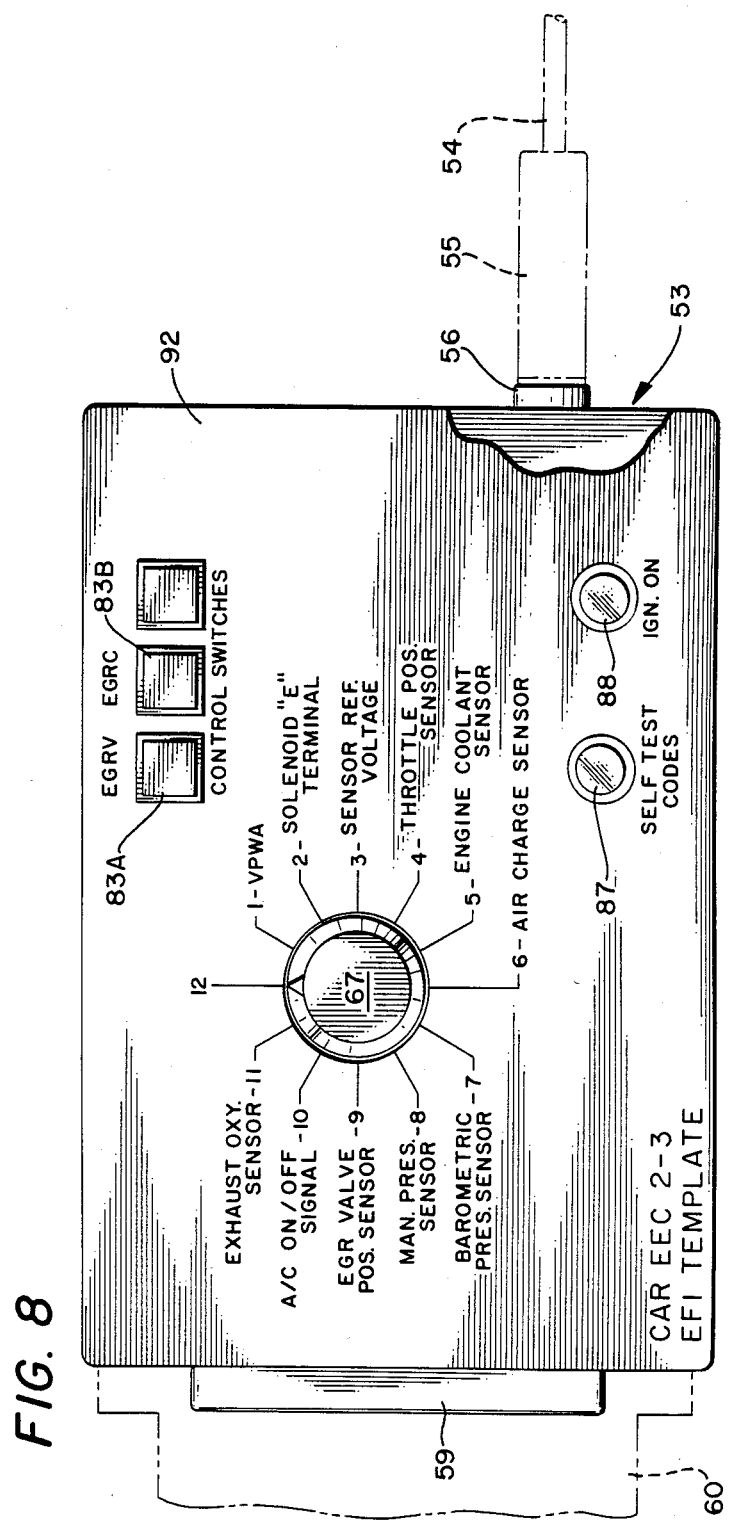

In the drawings:

FIG. 1 represents a perspective view of a prior art electronic engine control system test analyzer produced for a specific vehicle model;

FIG. 2, an exploded perspective view of a new improved test switching control box the interconnect plug and cable connection for a digital volt meter or oscilloscope, an overlay indicator panel and a wire harness for connecting the box to the electronic engine control system of a specific model vehicle;

FIG. 3, a wire harness configuration schematic such as the wire harness connectable to the test switching control box of FIG. 2 for a specific model vehicle;

FIG. 4, a circuit schematic of the test switching control box of FIG. 2;

FIG. 5, a perspective view of a rotary switch test switching control box variation from the box of FIGS. 2, 4 and 8;

FIG. 6, a perspective view of a push button equipped test switching control box;

FIG. 7, a perspective view of a slide switch equipped test switching control box; and FIG. 8, a top plan view of an overlay panel on the test switching control box of FIGS. 2 and 4 showing switch position information and light indicator legends on the panel for a specific vehicle being checked with the respective specific wire harness being used therewith.

Referring to the drawings:

The engine electronic control system test analyzer 40 of FIG. 1 (a prior art model) shown to be in a carrying case 41 provided therefore is a very complex test analyzer with many indicator lights 42 and 43. It is also shown to include two rotary multiposition switches 44 and 45 and many push button switches 46. It has an outlet socket 47 for connection to a special digital volt-/ohm meter (not shown) that with the connection is special only for the specific control system test analyzer 40 as provided by a major vehicle manufacturer for a specific vehicle engine electronic control system. A special specific wire harness 48 is provided for connection of its male connector 49 in analyzer socket 50, and its male connector 51 and female connector 52 for testing connection with the vehicle engine electronic control system.

With the improved engine electronic control test switching control box 53 of FIG. 2 a connection cable 54 having a plug in connection 55 receivable in box plug receptacle 56 is provided for a connection to a standardized digital volt/ohm meter or oscilloscope (not shown) via cable plug receptacle 57. The box 53 is also provided with a multi-pin 58 connector 59 for connection with female socket connector 60 of a wire harness 61 having a multi-pin 62 connector 63 and a female socket 64 connector 65 for testing connection with a specific vehicle engine electronic control system. Referring also to FIG. 3 the female socket connector 60 has various female sockets 66 thereof connected to various specific lines of the wire harness 61 interconnecting respective pins 62 of connector 63 to the corresponding female sockets 66 of connector 60. When the wire harness 61 is connected for test analysis of an engine electronic control system the wire harness 61 interconnects a female connector and a male connector that are normally connected together in the control system with connectors 63 and 65 being connected thereto, and connector 60 is connected to box connector 59.

Referring also to the circuit schematic of FIG. 4 for the test switching control box 53 rotary switch 67 has a center post 68 line 69 connection to the digital volt- /ohm meter or oscilloscope jack connector 56. The rotary switch contact 70 is rotatable to a plurality of line connection contacts 71, 72, 73, 74, 75, 76, 77, 78, 79, 80, 81, and 82 for selective switch testing of various functions connected through respective pins 58 in connector 59 to lines in harness 61 and thereby in the specific vehicle engine electronic control system being tested. EGRV and EGRC function push button switches 83A and 83B are provided in box connection lines 84 and 85, respectively, to a line 86 connection to jack connector 56 and self test light 87 along with ignition on light 88, and also line 89 to a pin 58 connection to harness 61. Self test light 87 and ignition on light 88 are connected through lines 90 and 91 to respective pin 58 connections to harness 61.

Engine electronic control test switching control box 53 is also provided with an interchangeable overlay indicator panel 92 that along with the wire harness a specific to a particular automotive vehicle model engine electronic control system. With the proper indicator panel 92 in place on the top of box 53 various test switch positions are identified as shown in FIG. 8. Different harnesses may be provided in place of harness 61 with different line connection variations from the sockets 66 of connector 60 to various lines of lines 101 through 132 interconnecting multi-pin 62 connector 63 to respective sockets 64 of connector 65 specific to a great range of vehicle models. Obviously specific interchangeable overlay indicator panels in place of panel 92 must be provided with different harnesses in place of harness 61 for specific vehicle models.

The rotary switch test switching control box 53' shown in FIG. 5 while having many features in common with the box 53 of FIGS. 2, 4 and 8 is a larger box more versatile box capable of being used with a range of complex engine electronic control systems. It is shown to have six rotary switches 132–138, three indicator lights 139, 140 and 141 and three push button switches 142, 143 and 144 in place of one rotary switch 67, two indicator lights 87 and 88 and three push button switches on box 53. It also has connector 56' and harness connector 59' just as with connectors 56 and 59 on box 53.

The box 53" shown in FIG. 6 is a push button box with three indicator lights 142", 143" and 144" and many push button switches 145 without any rotary switches. This box also has connectors 56" and 59" just as with connectors 56 and 59 on box 53.

The box 53''' shown in FIG. 7 is a slide switch equipped test switch control box with two slide switches 146 and 147, three indicator lights 142''', 143''' and 144''' and four push button switches 148, 149, 150 and 151 along with a toggle switch 152. This box also has connectors 56''' and 59''' just as with connectors 56 and 59 on box 53.

Whereas this invention has been described with respect to several embodiments thereof, it should be realized that various changes may be made without departure from the essential contributions to the art made by the teachings hereof.

I claim:

1. An electronic engine control system test analyzer in a system comprising: a digital volt/ohm meter, an electronic engine control system; a switching control box with connector means connectable to said digital volt/ohm meter, test connection switching means, and test indicator means; and a switching control box to electronic engine control system interconnect wire harness specific to said electronic engine control system; wherein said wire harness has a multi-contact connector connection with said control box, a multi-pin connector, and a multi-contact female socket connector in order that said wire harness interconnect a mating set of connectors in said electronic engine control system for testing thereof by said test analyzer; wherein wire lines in said wire harness are connected to different wire lines interconnecting said multi-pin connector and said multi-contact female socket connector in said wire harness in providing wire harnesses for specific vehicle model electronic engine control systems interchangeably connectable to said switching box for individualized testing of respective specific vehicle model electronic engine control systems; and wherein on overlay indicator panel is provided for the top of said switching control box consistent with the interconnect wire harness specific to a vehicle electronic engine control system being tested.

2. The electronic engine control system test analyzer of claim 1, wherein said test indicator means includes an engine an indicator and a self test indicator.

3. The electronic engine control system test analyzer of claim 2, wherein said test connection switching means includes a plurality of push button switches.

4. The electronic engine control system test analyzer of claim 3, wherein said test connection switching means includes a rotary switch.

5. The electronic engine control system test analyzer of claim 3, wherein said test connection switching means includes a plurality of rotary switches.

6. The electronic engine control system test analyzer of claim 3, wherein said test connection switching means also includes slide switch means.

7. The electronic engine control system test analyzer of claim 2, wherein said test connector means is a plurality of push button switches.

8. The electronic engine control system test analyzer of claim 1, wherein said test indicator means is a plurality of indicator lights.

* * * * *